US008665040B1

(12) United States Patent
Chappell et al.

(10) Patent No.: US 8,665,040 B1
(45) Date of Patent: Mar. 4, 2014

(54) FIELD PROGRAMMABLE FILTER ARRAY

(75) Inventors: William J. Chappell, Lafayette, IN (US); Dimitrios Peroulis, West Lafayette, IN (US); JuSeop Lee, West Lafayette, IN (US); Eric J. Naglich, Lafayette, IN (US); Hjalti H. Sigmarsson, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 351 days.

(21) Appl. No.: 13/044,295

(22) Filed: Mar. 9, 2011

Related U.S. Application Data

(60) Provisional application No. 61/312,103, filed on Mar. 9, 2010.

(51) Int. Cl.
*H01P 1/20* (2006.01)
*H03H 7/01* (2006.01)

(52) U.S. Cl.
USPC ............................ 333/203; 333/174; 333/205

(58) Field of Classification Search
USPC .......... 333/174–176, 202, 203, 205, 219, 168
See application file for complete search history.

(56) References Cited

U.S. PATENT DOCUMENTS 4,571,560 A * 2/1986 Dobrovolny .................. 333/174
5,515,017 A * 5/1996 Yamada et al. ............... 333/207
6,801,102 B2 * 10/2004 Shamsaifar et al. .......... 333/174

OTHER PUBLICATIONS

X. Liu, L. P. B. Katehi, W. J. Chappell, and D. Peroulis, "A 3.4-6.2 GHz Continuously tunable electrostatic MEMS resonator with quality factor of 460-530," IEEE MTT-S International Microwave Symposium Digest, Jun. 7-12, 2009, pp. 1149-1152.

H. Joshi, H. H. Sigmarsson, S. Moon, D. Peroulis, and W. J. Chappell, "High Q Narrowband Tunable Filters With Controllable Bandwidth," IEEE MTT-S International Microwave Symposium Digest, Jun. 2009, pp. 629-632.

H. H. Sigmarsson, A. Christianson, H. Joshi, S. Moon, D. Peroulis, and W. J. Chappell, "In-Situ Control of Tunable Evanescent-Mode Cavity Filters Using Differential Mode Monitoring," IEEE MTT-S International Microwave Symposium Digest, Jun. 2009, pp. 633-636.

H. Joshi, H. H. Sigmarsson, S. Moon, D. Peroulis, and W. J. Chappell, "Tunable High Q Narrow-Band Triplexer," IEEE MTT-S International Microwave Symposium Digest, Jun. 2009, pp. 1477-1480.

A. E. Atia and A. E. Williams, "Narrow-Bandpass Waveguide Filters," IEEE Transactions on Microwave Theory and Techniques, vol. 20, No. 4, pp. 258-265, Apr. 1972.

(Continued)

*Primary Examiner* — Benny Lee
*Assistant Examiner* — Rakesh Patel
(74) *Attorney, Agent, or Firm* — Maginot, Moore & Beck LLP

(57) ABSTRACT

A field programmable filter array with high spectral isolation and reconfigurability. A bank of resonators can be programmed at will and on the fly to give any type of filtering response. The order, type and bandwidth of the filter are electronically reconfigured. Each subset of resonators can switch between bandstop and bandpass configurations and form custom filter shapes consisting of combinations of bandstop and bandpass filters. The filter can include a unit cell of a resonator with a series of switches to enable coupling to any of its nearest neighbors. The path in which the flow of energy takes through the array of resonators is dynamic, and the filtering function which is created is dialable on demand.

12 Claims, 13 Drawing Sheets

(56) References Cited

OTHER PUBLICATIONS

J. Lee and K. Sarabandi, "A Miniaturized Conductor-Backed Slot-Line Resonator Filter With Two Transmission Zeros," IEEE Microwave and Wireless Components Letters, vol. 16, No. 12, pp. 660-662, Dec. 2006.

* cited by examiner

FIELD PROGRAMMABLE FILTER ARRAY

CROSS-REFERENCE TO RELATED APPLICATION

This application claims the benefit of Provisional Patent Application No. 61/312,103, filed Mar. 9, 2010, which application is hereby incorporated by reference along with all references cited therein.

GOVERNMENT RIGHTS

This invention was made with government support under Contract/Grant No. W15P7T-06-C-P635 awarded by DARPA. The government may have certain rights in the invention.

BACKGROUND OF THE INVENTION

This invention relates to tunable filters of the type used in electronic communication systems, and more particularly to reconfigurable filters.

Problems exist with wireless systems in the presence of high power interferers such as are encountered in electronic warfare. One typical scenario, depicted in FIG. 1, involves a military convoy transmitting high power interferers, i.e., jamming signals, while operating sensitive receivers. High power interferers can cause an RF receive chain to saturate or cause an A/D converter to overflow, corrupting the capability of the receiver. Many systems are currently not able to work in the presence of high power transmitters, and co-site interference is a common problem.

Traditional time-duplexing techniques limit the performance of systems as they attempt to share spectrum. Transmissions can be coordinated such that there is only reception when a transmitter is turned off, but this severely limits capacity.

SUMMARY OF THE INVENTION

One aspect of the present invention is a field programmable filter array comprising an array of resonators, and a variable coupling mechanism for coupling a first of the resonators to a selected one of its neighboring resonators, the coupling mechanism capable of altering filter bandwidth and selectively redirecting energy between resonators.

Another aspect of the present invention is a reconfigurable filter capable of selectively operating in a bandpass mode or a bandstop mode. The reconfigurable filter comprises first and second adjacent high-Q resonators and a feed layer over the resonators, the feed layer having first and second slot apertures therethrough for magnetic field coupling to the first and second resonators, and the filter is selectively configurable to bandpass mode or to bandstop mode by electronically altering the feed layer either to create an effective short circuit therein or to create a through line, respectively.

Another aspect of the present invention is a field programmable filter array comprising a plurality of filter unit cells each having a plurality of degrees of reconfigurability including electronically reconfigurable filter type, order and bandwidth.

Certain embodiments of the present invention provide a concurrent transmission method with high levels of spectral isolation, i.e., isolation between different tunable frequencies, effective to allow for simultaneous operation of transmitters and receivers, increasing the speed and performance of wireless systems. In one embodiment, the isolation carves out regions of the spectrum that protect very narrow spectral bands in which wireless systems (radar, communications, etc.) can simultaneously operate even when a high power system is nearby as is the case in a typical jamming scenario. Intermodulation products of the interferers that fall within the receive band can be notched out with a bandstop filter in the transmitter. A bandpass filter in the receiver protects the band of interest from the interference, both co-site and external.

One embodiment of the invention is a field programmable filter array with high spectral isolation and reconfigurability. The filter array comprises a bank of resonators which can be programmed at will and on the fly to give any type of filtering response required, e.g., switching between bandstop and bandpass configurations.

The objects and advantages of the present invention will be more apparent upon reading the following detailed description in conjunction with the accompanying drawings.

DESCRIPTION OF THE PREFERRED EMBODIMENTS

Figure 1:
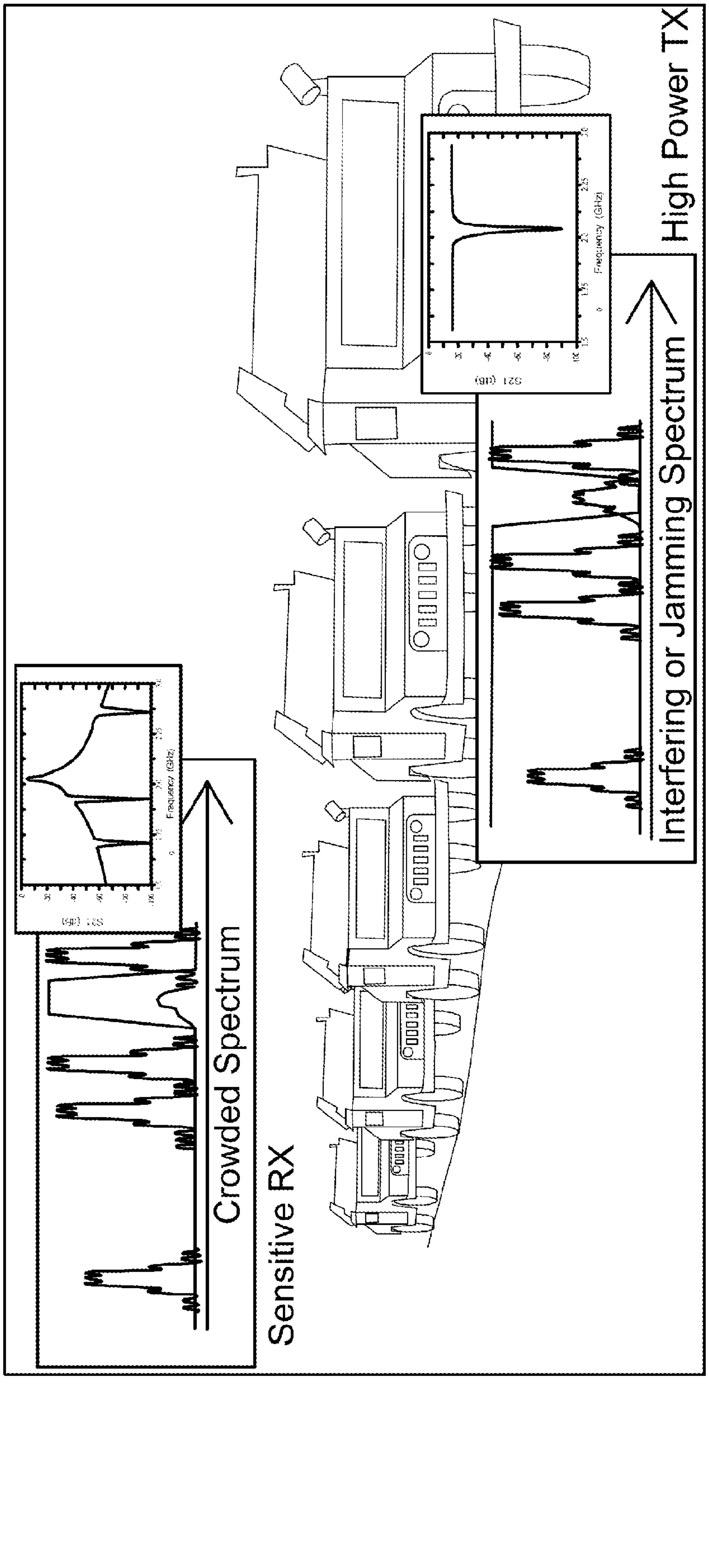
FIG. 1 is a picture and showing an example situation in which the field programmable filter array could be beneficial.

For the purpose of promoting an understanding of the principles of the invention, reference will now be made to the embodiments illustrated in the drawings and specific language will be used to describe the same. It will nevertheless be understood that no limitation of the scope of the invention is thereby intended, such alterations and further modifications in the illustrated device and such further applications of the principles of the invention as illustrated therein being contemplated as would normally occur to one skilled in the art to which the invention relates.

Figure 2A:
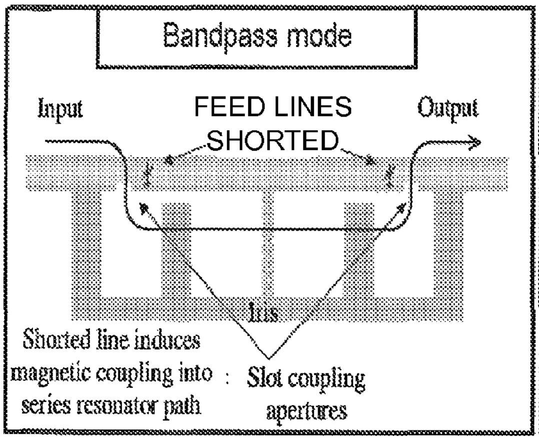
FIGS. 2A and 2B are cross-sections of a reconfigurable filter in bandpass mode and bandstop mode, respectively. The filter uses the same resonators for both operating modes.
Figure 2B:
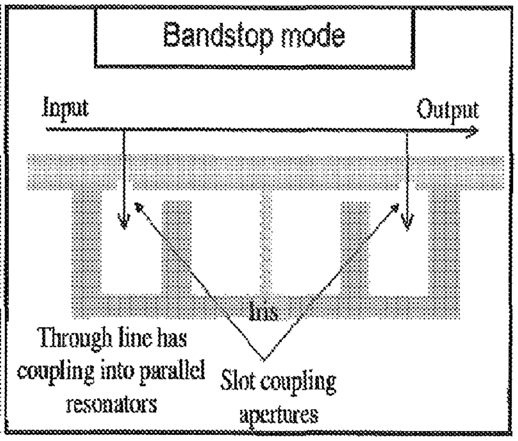
Figure 3A:
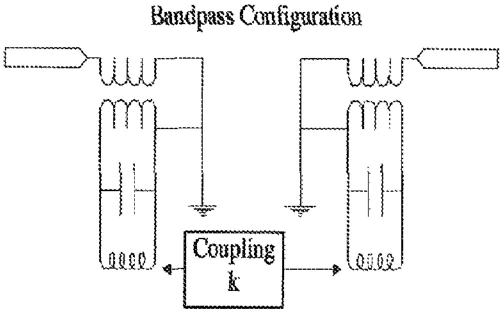
FIGS. 3A and 3B are the equivalent circuits of the resonators of FIG. 2, for the bandpass and bandstop configurations, respectively.
Figure 3B:
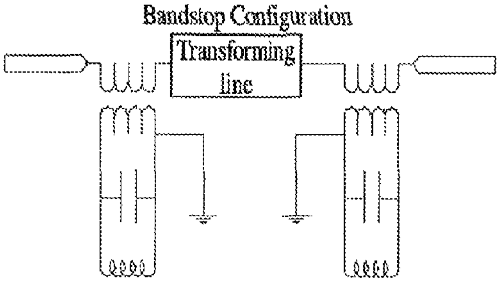

In certain embodiments of the present invention, an individual resonator is retasked to be in either bandstop or bandpass mode. This transformation is shown in FIG. 2. The device uses the same set of resonators for both bandpass mode and bandstop mode. A top layer feeds evanescent cavities in series (bandpass mode) or in shunt (bandstop mode). The equivalent circuit of the reconfigurable resonators is illustrated in FIG. 3. This transformation can demonstrate reconfiguration of analog spectral processing which changes based on the current electromagnetic environment.

A given set of resonators can be tasked into any number or type of filters. The number of poles of the filters may be varied depending on the path of the flow of energy. For example, if there are nine resonators allocated to the channel, there could be three resonators allocated for bandpass configuration and six resonators for various bandstop functions. These bandstop filters can take the form of a single 6-pole bandstop filter, three separate 2-pole filters, or even six individual bandstop resonances at different frequencies. Alternatively, these nine resonators could be shown to have all bandstop filter or all bandpass filter functionality.

Cavity filter designs [3] are improved upon to develop designs for variable impedance boundaries for cavities. The variable impedance boundaries can be created such that the cavity resonators will not have defined sizes, but can be tuned dynamically, effectively changing the inductance of the cavity.

Figure 5:
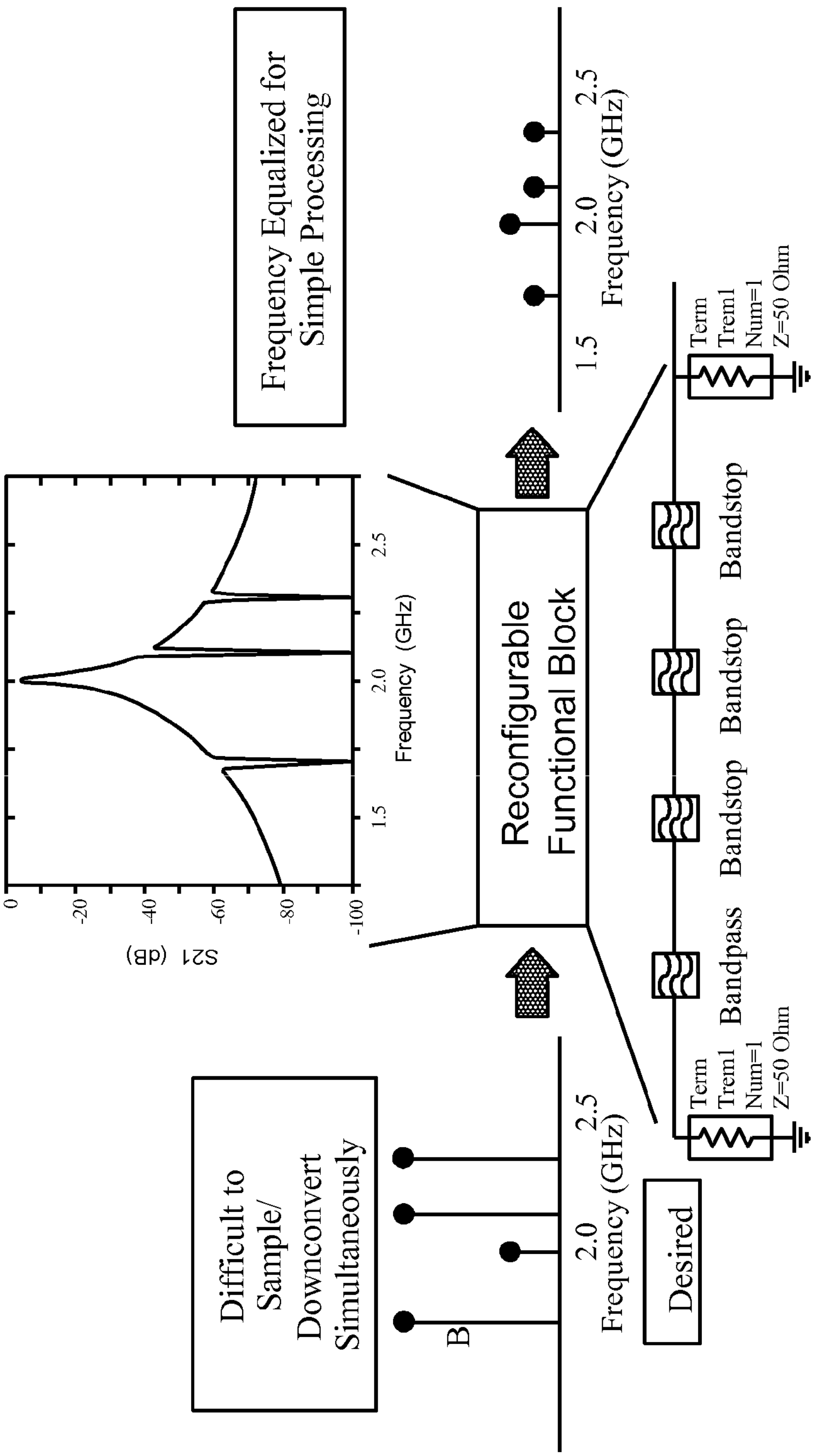
FIG. 5 is a representation of a reconfigurable functional block.

A cascade of bandpass and bandstop filters can provide the targeted levels of isolation for concurrent operation of electronic warfare systems. This also will enable concurrent operation of electronic warfare systems with communications, radar, and any other wireless system which operate in the presence of high power interferers. If these tunable filters are placed in series, the bandstop filter(s) will create spectral regions of very deep nulls within the skirts of the bandpass filter. This concept is shown in FIG. 5 which illustrates reconfigurable functional block consisting of a 2-pole bandpass filter followed by three bandstop filters. In the illustrated example of FIG. 5 the bandpass filter is centered at 2 GHz with a 25 MHz 3 dB bandwidth (BW) and the bandstop filters block interferers at 1.7, 2.1, and 2.3 GHz. All filters are assumed to have a Q of 1,000. The frequencies included are examples and not specific to any particular application.

By isolating the desired spectrum with a narrowband bandpass filter and rejecting interferers with bandstop filters, levels of isolation normally associated with much larger filters and larger number of poles can be achieved.

In order to get this level of performance, it is necessary to have both bandpass and bandstop filters which tune over an octave in frequency with high speed tuning. By dynamically cascading these intelligently together, there will be unrivaled performance for front end filtering, giving the spectrum shown in FIG. 5.

The array of resonators may be in the packaging of a device, as a standalone unit or as an on chip implementation. The implementations will have different quality factors but each has a different role in different applications depending on the bandwidths required. This device may be placed pre-LNA, i.e., before a low-noise amplifier in a receiver, in order to avoid compression of the amplifier or behind the LNA in a lossier version but useful for protecting the mixer from non-linear operation due to out-of-band interference.

This is contemplated to be particularly useful for scaled CMOS and SiGe circuits where the out-of-band signals are particularly problematic due to the low voltages of operation. A dynamic protection system is useful to the operation of potentially massively integrated wireless systems. Both transmit and receive can concurrently be enabled.

Using a combination of widely tunable bandpass and bandstop filters isolation on the order of 100 dB can be achieved. Electrostatically-actuated MEMS designs [1] can be used for high-Q widely tunable filters [2]-[6] which are reconfigurable. 100 dB of isolation can be created between a transmit and receive chain so that concurrent operation of a system is possible in electronic warfare systems.

Advanced Reconfigurable Filter Design

A bank of resonators can be programmed at will to give any type of filtering response required. One example is a high-Q, substrate integrated, tunable bandstop filter. Another example is a design which can switch between bandstop and bandpass configurations. Another example has variable number of poles. Yet another example includes a "sea of resonators" or "field-programmable gate array (FPGA)-like resonators" which can be reconfigured as desired. Another example involves the use of variable impedance boundaries to dynamically change the shape of the resonators.

Dynamic Bandpass/Bandstop Reconfiguration

Multipole tunable bandstop filters can be used. The design process takes into account the fact that the out of band response needs to look like a "through". A redesign of the filters accommodates tuning over a very wide range while holding the bandstop shape and keeping a deep null.

Complicating the design is that traditional bandstop filters have a quarter wavelength of line between resonators. Unlike the bandpass filter which does not have sections which are wavelength sensitive (and therefore frequency sensitive), the bandstop is designed for a particular wavelength. For wide tuning ranges, the transformer could be considerably less than a quarter wave at lower frequencies in the band with minimal distortion of filter shape and impedance matching. Implementing tunable bandwidth can be achieved by loading the transmission line between the resonators with shunt varactors or by spanning the resonator coupling slots with varactors to dynamically tune their sizes. It is contemplated that a 2-to-1 tuning range is possible while holding the necessary shape.

The desire to isolate the spectrum with bandpass or bandstop filters, as well as the number of poles desired in each filter, will change based on the interference that is present at any instant in time. Therefore, the ability to switch from a bandpass to bandstop filter is desirable. Simplifying this design is the fact that the resonators can be created one layer of substrate below the feed layer and coupled into by slot apertures in the feed layer ground plane. By reconfiguring the feed layer, the high-Q resonators can be placed in series (bandpass) or in parallel (bandstop) to the feed.

The design therefore includes the creation of a feed which can couple into the resonators in series or parallel.

In a bandstop configuration, the feed line will be a through line which will magnetically couple to the resonators below through slots in the microstrip ground plane. These slots therefore couple shunt resonators to the feed line that shunt energy of the tuned frequency that would otherwise pass on the through line. When the resonators are not active (off of the frequency of interest for example), the microstrip will look just like a simple microstrip through line, with the marked difference that there will be slots in the ground plane (see FIG. 2B for example).

In a bandpass configuration, the magnetic field will couple into the resonators in a series configuration. The feed line will be shorted above the slots or designed with a virtual short above the resonators. The energy will be reflected for frequencies out of the pass band of the filter, and pass through the resonators for frequencies in the pass band, causing the filtering effect (see FIG. 2A for example).

To switch between these two states, the through feed line can simply be shorted at the locations of the slot. A virtual short to create the bandpass effect can be created through a high impedance section of line one quarter wavelength (λ/4) from the slots. The advantage of this approach is the creation of a phase shifting effect on the line which can be used to control the bandstop filter. A representative design is shown in FIG. 2, in a physical cavity, and FIG. 3, for an equivalent circuit.

Multipole Reconfigurability

Central to the concept of reconfigurable channels with deep nulls is the capability to have nulls that tune throughout a desired frequency range. Notch filters and bandpass filters can be created simultaneously. The bandstop filters complement the current designs and are capable of simultaneous transmit and receive demonstrations with good dynamic range. A maximum transmit signal can be broadcast while simultaneously communicating on adjacent bands. The high-Q performance can allow notch filtering of an extremely tight spectrum. Both the out-of-band loss and the depth of the null are dramatically affected by the quality factor. This complementary technology can enable concurrent receive and transmit signals in a crowded environment. The tunable notch filters can have as much applicability as the bandpass filters. Ultra-high dynamic range systems can be demonstrated while using the complementary pair of notch and bandpass filters which can be dynamically changed. Resonators can be dynamically retasked as needed to be either bandpass or bandstop. This will be illustrated in the discussion below of both the capabilities of retasking for bandstop or bandpass functionality as well as allowing a variable number of resonators for each filter.

Figure 4:
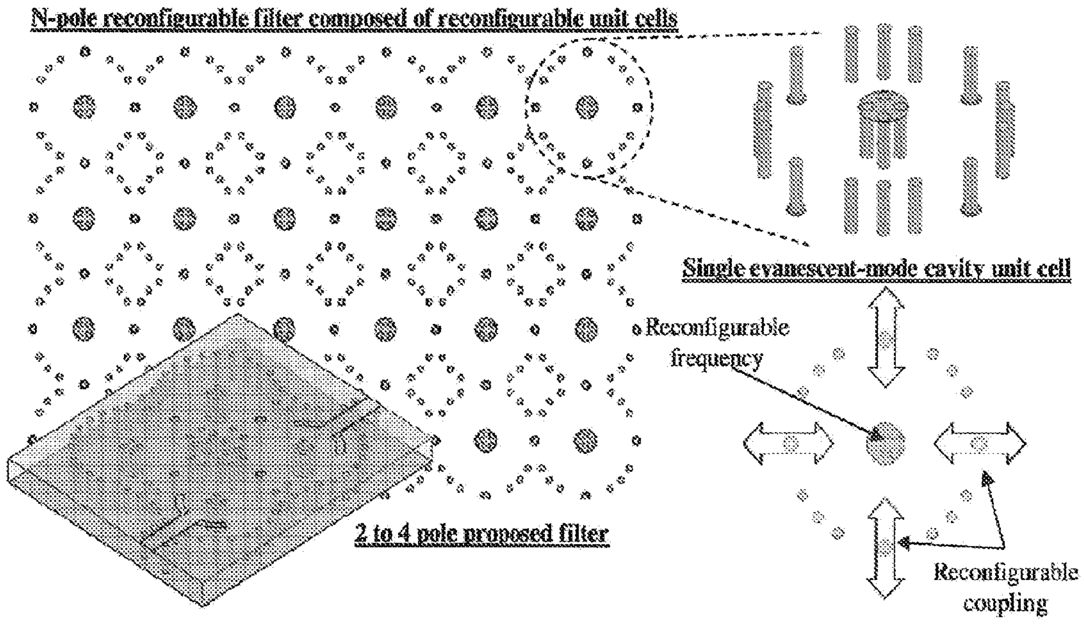
FIG. 4 shows reconfigurable filters.
Figure 6:
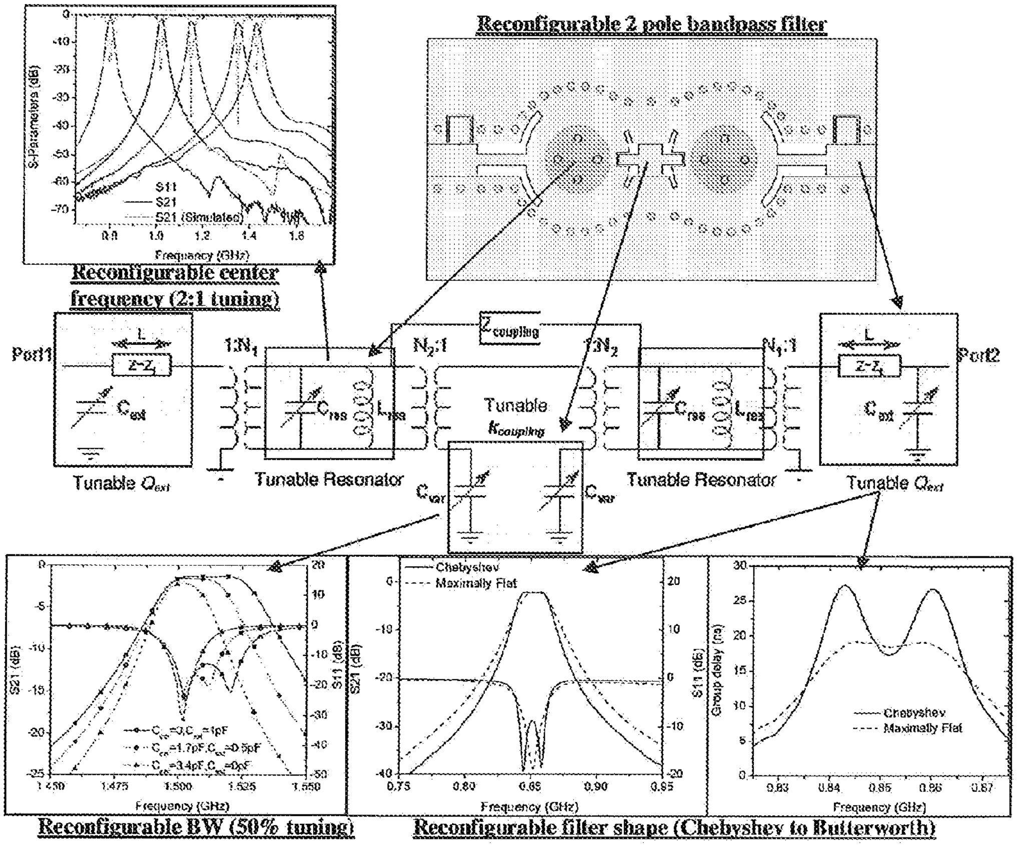
FIG. 6A shows a single electronically reconfigurable tunable bandpass filter, the frequency response of which is shown in FIGS. 6B-6E.

A fully reconfigurable 2-pole bandpass filter has been demonstrated [6]. This allowed for a variable external Q, a variable inter-resonator coupling, and wideband center frequency tuning. The filter layout and circuit schematic are shown in FIG. 6A which illustrates a single electronically reconfigurable tunable bandpass filter. The measured performance is shown in FIGS. 6B-6E. This filter has an octave tuning range with tunable bandwidth and filter shape. By switching between Chebyshev and maximally flat filter shapes, minimal group delay, ripple, and maximized power handling capabilities can be dynamically created. However, the spectral isolation is limited by the number of poles included. Better isolation can be created with more poles as sharper filter skirts are induced, however with the tradeoff of more insertion loss. Tuning the number of poles to have full control over the frequency selectivity is desirable. In order to achieve this control, a reconfigurable order filter can be constructed using multiple filter unit cells, each with several degrees of reconfigurability such as frequency tuning and tunable input/output coupling. An example of an array of unit cells is shown in FIG. 4, which demonstrates filter control. The signal can be spatially distributed through a "sea of resonators". This can allow for a reconfigurable filter order and also allow multiple filters operating side by side sharing resonators and reconfiguring as needed. This system can demonstrate high levels of reconfigurability. The use of reconfigurable unit cells can enable full electronic control of frequency, bandwidth, filter shape, and filter order.

Furthermore, combining the bandpass to bandstop reconfigurability with the sea of resonators can provide a very powerful reconfigurable filter that can handle a number of challenging interference situations. If there are many interferers, the filter path can be dedicated to bandpass functionality. However if there are a few interferers of very high power, these resonators can be dedicated to the bandstop functions.

The resonators can be implemented in different states. A linear series of eight resonators can switch from bandstop to bandpass functionality. Furthermore, building blocks of four resonators each in a square configuration can be retasked into bandpass and bandstop functions as desired. These filter building blocks can be cascaded to show very unique transmission capabilities with multiple nulls and pass bands. The building blocks can be placed in an array such that it can be tailored to a variety of applications.

The reconfigurability is accomplished by the creation of variable coupling coefficients that can both alter the bandwidth of the filter while also redirecting the energy from one resonator to another. The coupling mechanism can "shut the door," effectively closing off one resonator from the other and steering the energy to a nearest neighbor resonator. The "door" (the coupling mechanism between resonators) can be opened and/or partially opened which can control the coupling coefficient and can enable the capability of creating multiple poles in a filter response.

A variable bandwidth can be created with coupling mechanism between the resonators [3] in which the transmission lines were loaded with varactors. Through the use of both varactors and switches in order to "close the door" a larger coupling variation can be achieved. In order to balance the reduction in Q with the need to increase the coupling variation, the varactor can be strategically placed to reduce the total amount of electric field that is stored in the variable component.

Couplings are traditionally unbounded and not controllable. However, by placing this adaptable coupling mechanism between resonators in an array, the flow of energy through a sea of resonators can be guided.

Advanced Filter Synthesis and Coupling Design—Enabling Feedback

A filter with a reconfigurable order can demonstrate the advanced adaptable coupling between the resonators. The filter structure is shown in the bottom left of FIG. 4. This filter can be operated using either two or four poles. This is an example of a direct coupled filter.

An advanced aspect of filter design is to move away from the direct coupled filter designs. While isolation levels of 60 dB have been achieved away from the pass band, this level can be enhanced by the creation of zeros that provide much deeper nulls which can also decrease the frequency spacing between the pass band and the null.

To realize an arbitrary transfer function, both cross coupling and direct coupling are desired [7]. An arbitrary transfer function will have both poles and zeros. The transmitted power ratios (roughly considered the filter shape) of $n^{th}$-order Butterworth filter and Chebyshev filter, both direct coupled filters, are given by the first two equations below.

Butterworth Filter $$|t(S)|^2 = \frac{1}{1 + \varepsilon^2 S^{2N}}$$

Chebyshev Filter $$|t(S)|^2 = \frac{1}{1 + \varepsilon^2 \left| \sum_{k=1}^{N} (S - S_k) \right|^2}$$

-continued

Elliptic Filter $$|t(S)|^2 = \frac{1}{1 + \varepsilon^2 \frac{\left|\sum_{k=1}^{N}(S - S_k)\right|^2}{\left|\sum_{k=1}^{T}(S - S_{pk})\right|^2}}$$

Figure 7A:
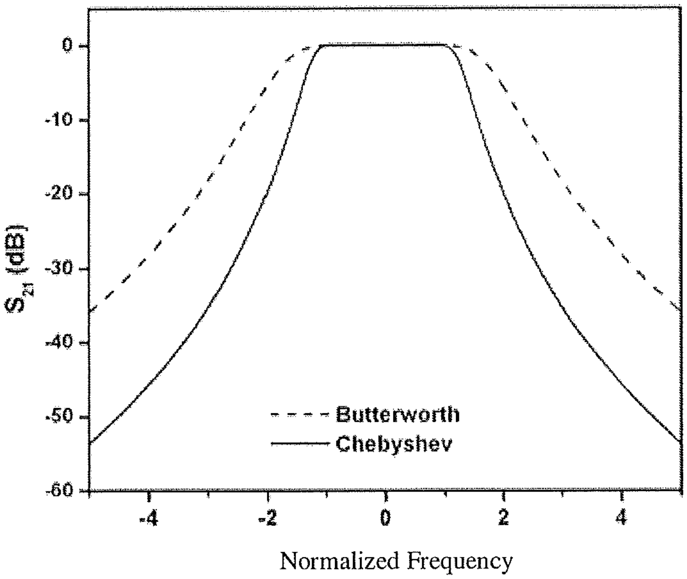
FIG. 7A shows a comparison between a 4th order Butterworth and Chebyshev filter response.
Figure 7B:
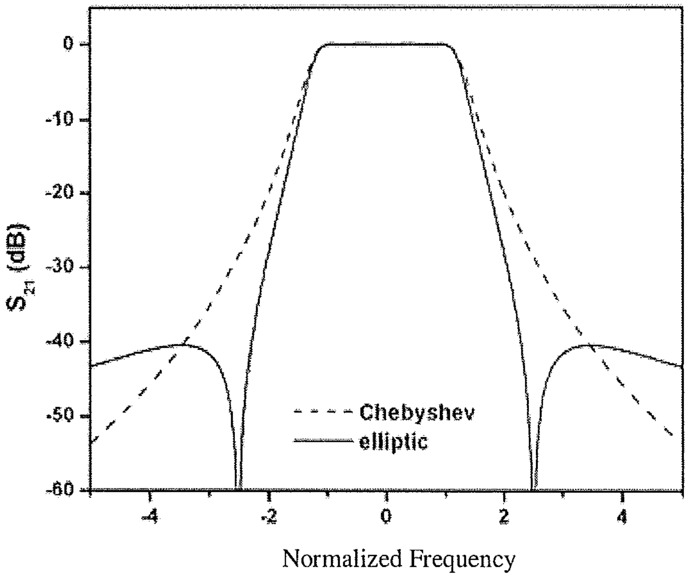
FIG. 7B shows a comparison between a 4th order Chebyshev and elliptic filter response.
Figure 8A:
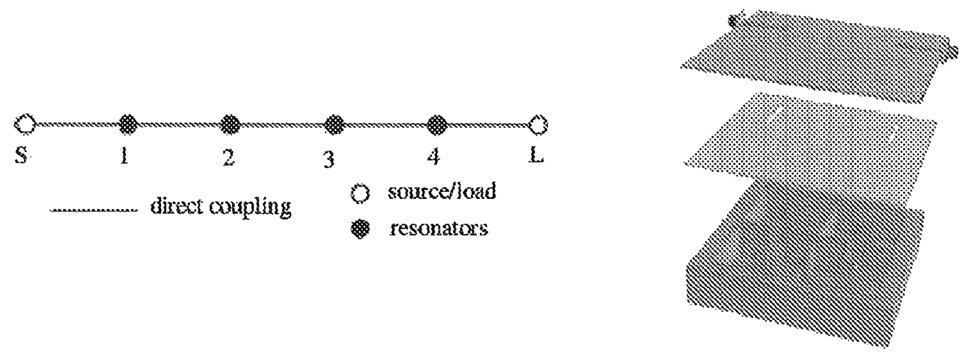
FIG. 8A illustrates a 4th-order filter with direct coupling between consecutive resonators.
Figure 8B:
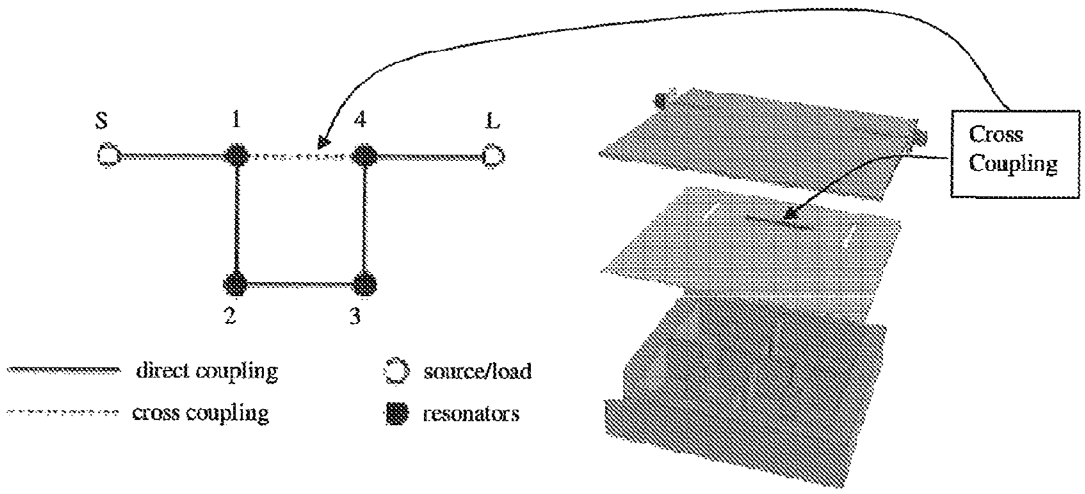
FIG. 8B illustrates a 4th-order filter *6b* with cross coupling between resonator 1 and 4.

The transfer function is t(S) and $\epsilon$ is the ripple factor. $S_k$ is reflection zero where there is no reflection, $S_{pk}$ is the transmission zero where there is no signal transmission and T is the number of transmission zeros. Of specific note is the fact that the first two equations describe polynomials that are both in the denominator. At specific frequencies there will be only poles to shape the filtering function. FIG. 7A shows frequency responses of $S_{21}$(dB) of 4th-order Butterworth filter and Chebyshev filter which have the same maximum amplitude variation in the pass band. These filters do not have transmission zeros at finite frequencies but at positive and negative infinite frequencies. This means that there is no way to control the location of transmission zeros (nulls). However, with coupling of the opposite order, zeros in the response can be created as described by the elliptic filter in the third function, by creating polynomials in the numerator of the transfer function. FIG. 7B illustrates a comparison between a 4th order Chebyshev and elliptic filter response showing identical pass band performance but with a significantly improved rejection. The physical realization and the coupling routing diagram of these filters are demonstrated in FIG. 8A and FIG. 8B. Illustrated in FIG. 8A is a 4th-order filter with direct coupling between consecutive resonators (Chebyshev for example, corresponding to FIG. 7A). Illustrated in FIG. 8B is an example of a 4th-order filter with cross coupling between resonator 1 and 4 (elliptic for example, corresponding to FIG. 7B).

Figure 9A:
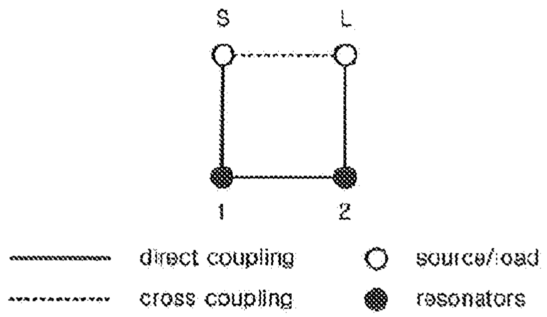
FIG. 9A illustrates and the coupling-routing diagram of a 2nd-order filter.
Figure 9B:
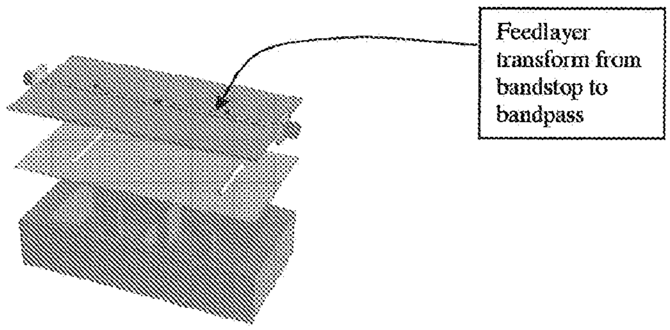
FIG. 9B illustrates a physical model of a 2nd-order evanescent-mode cavity filter.
Figure 9C:
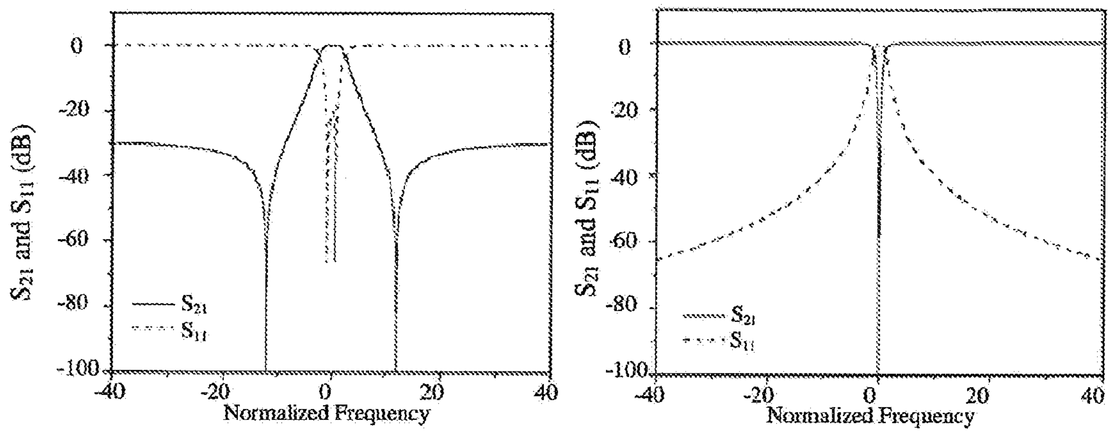
FIG. 9C illustrates the typical frequency responses of a $2^{nd}$-order filter with a cross coupling.

A 2-by-2 resonator filtering subunits can serve as basic building blocks for cascading together to create the optimal amount of nulls for a given electromagnetic spectrum. These basic building blocks can give selective feedback in order to notch out a portion of the spectrum (elliptical designs), or transform completely to create bandstop functions. FIG. 9A shows a coupling-routing diagram of the 2-pole filter. If the cross-coupling is negative and small compared to the direct coupling, the filter becomes a 2-pole elliptic response filter [8]. Also this filter structure can be tuned so that the filter has large coupling between the source and load. A physical realization in which the feed microstrip line is reconfigurable is shown in FIG. 9B. The varactors in the microstrip feed structure (upper layer) can control couplings so that the filter can be switched from bandpass filter to bandstop filter and vice versa. FIG. 9C shows the typical frequency response of the filter with bandpass characteristics and bandstop characteristics in the normalized frequency domain.

Figure 10:
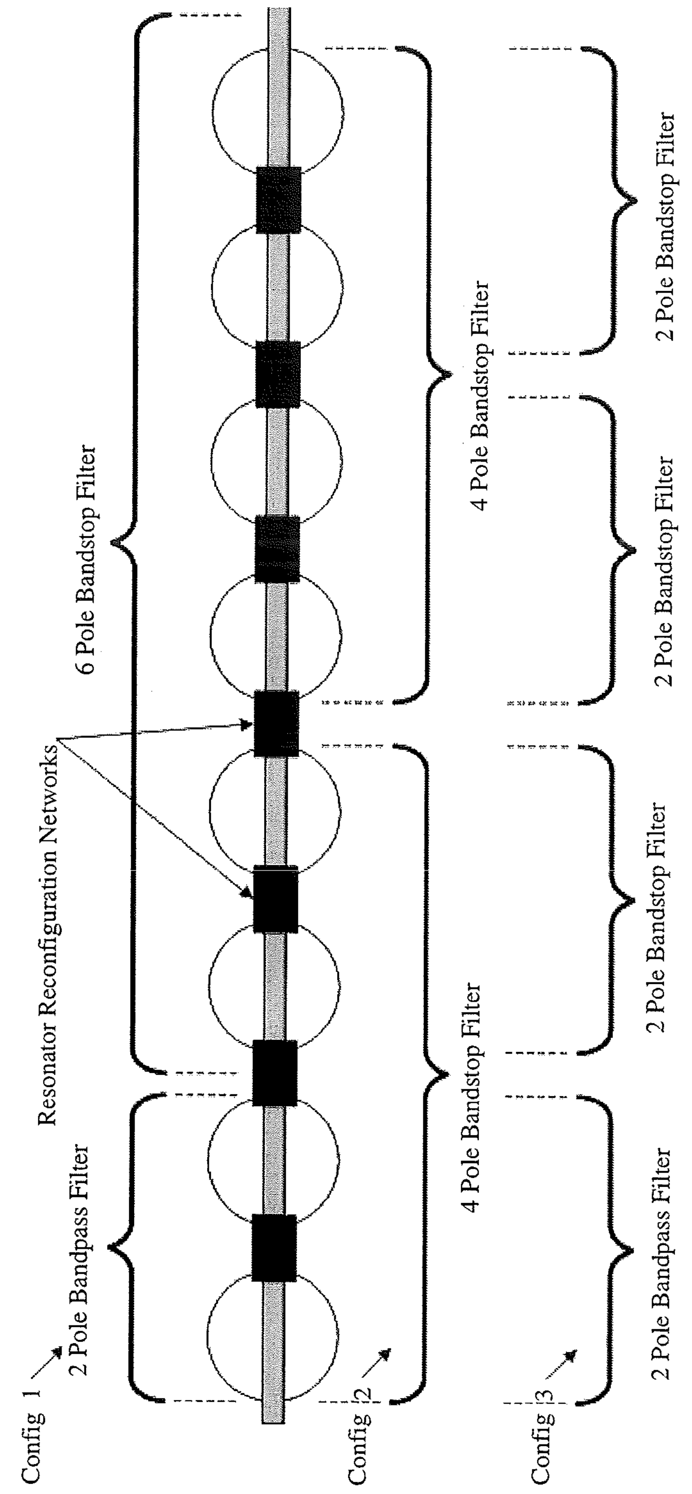
FIG. 10 shows eight series resonators that are reconfigurable into any possible set of bandpass and bandstop filters.

Linear Resonator Array—Bandpass to Bandstop Alterations with a Variable Numbers of Poles A series configuration of up to eight resonators is demonstrated with bandpass and bandstop functionality where each filter has reconfigurable number of poles, frequency, bandwidth, and filter shape. In FIG. 10, an example of eight resonators in series with adjustable coupling between each resonator is shown. Three different modes of operation are depicted. The first configuration (config. 1) is a 2-pole bandpass filter followed by a 6-pole bandstop filter which would be ideal for isolation from a single very large interferer. The second response (config. 2) shown is a 4-pole bandpass filter with a 4-pole bandstop filter which would be useful for better isolation across the entire range of out of band frequencies due to the increased filter skirts of having more emphasis on the bandpass filtering. Finally, a 2-pole bandpass filter is followed by three 2-pole bandstop filters (config. 3) which would be ideal for a number of high power interferers. The last configuration matches the test case which was the introductory filter function shown in FIG. 5. Furthermore, eight single pole bandstop filters at eight different frequencies could be implemented, ideal for eight interferers. Any combination in between would be possible as well.

Square Configuration—Building Block Filtering Units

Figure 11A:
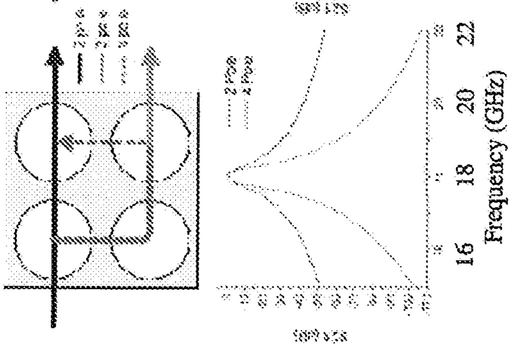
FIGS. 11A-11D illustrate reconfigurable 4 resonator filter blocks capable of forming variable order bandpass filters, filters with feedback, and bandstop filters.
Figure 11B:
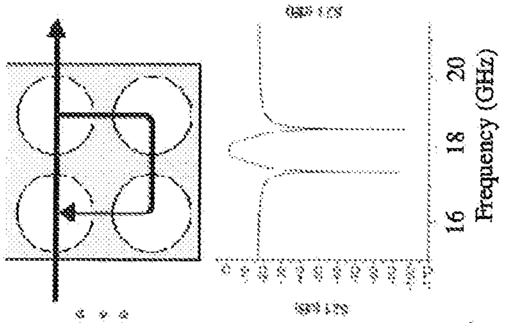
Figure 11C:
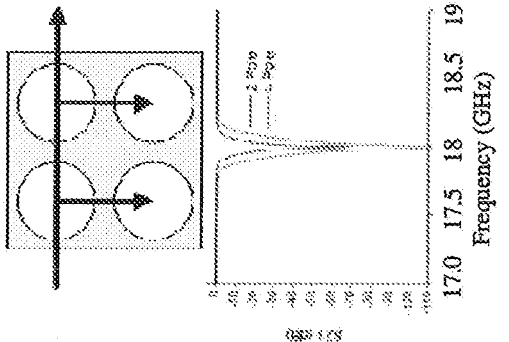

Another compact configuration would be to arrange the resonators in an array of 4 or more resonators made of fundamental filtering "units". FIGS. 11A-11D show four resonators in a 2-by-2 array, allowing coupling between adjacent resonators. These adjacent resonators can be used to perform multiple reconfigurable filter functions. This configuration can provide several different modes of operation, such as a variable order bandpass filter (FIG. 11A), an elliptic bandpass filter (FIG. 11B), and a variable order bandstop filter (FIG. 11C). The three modes are shown in FIGS. 11A-11C along with the typical frequency response for each mode.

Figure 11D:
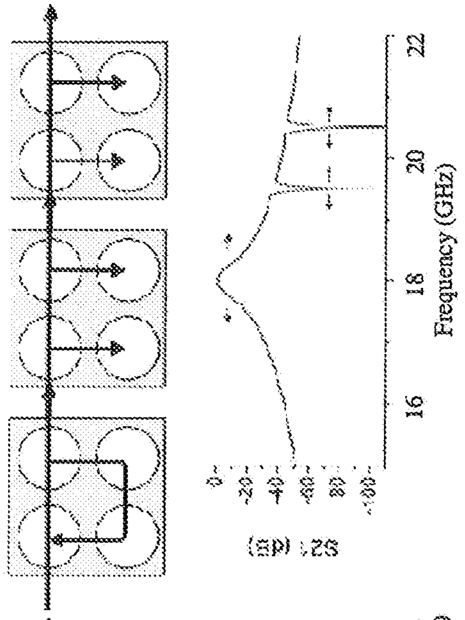

Each block of four resonators could be cascaded to form a larger resonator array approaching the FPGA-like resonator array shown in FIG. 4. An example of four rows of six resonators (twelve resonators in total) is also shown in FIG. 11D. This cascade will be able to configure itself into a variable number of poles of both bandpass and bandstop functions selectable by the user in response to the electrical environment. With a combination of bandpass and bandstop designs the filter array could isolate an interferer with greater than 100 dB of isolation, preferably in multiple stopbands.

Figure 12A:
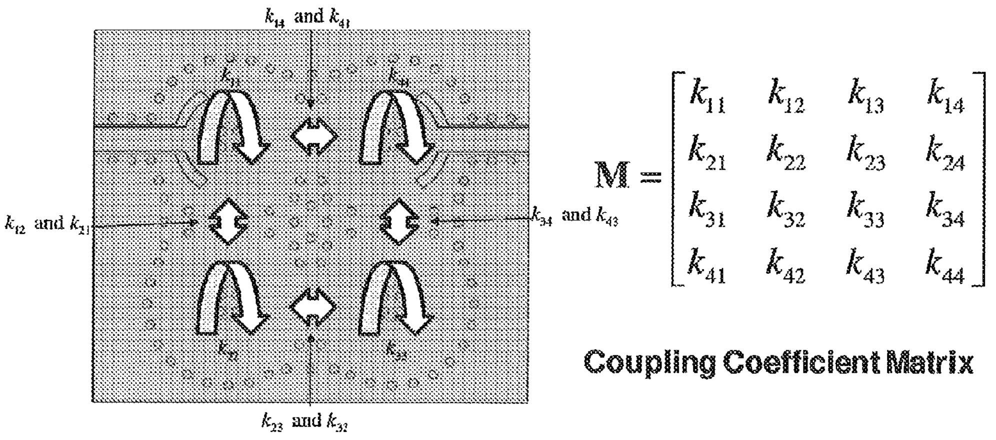
FIG. 12A illustrates a top view of a 2 to 4 pole filter with the corresponding coupling coefficient matrix.
Figure 12B:
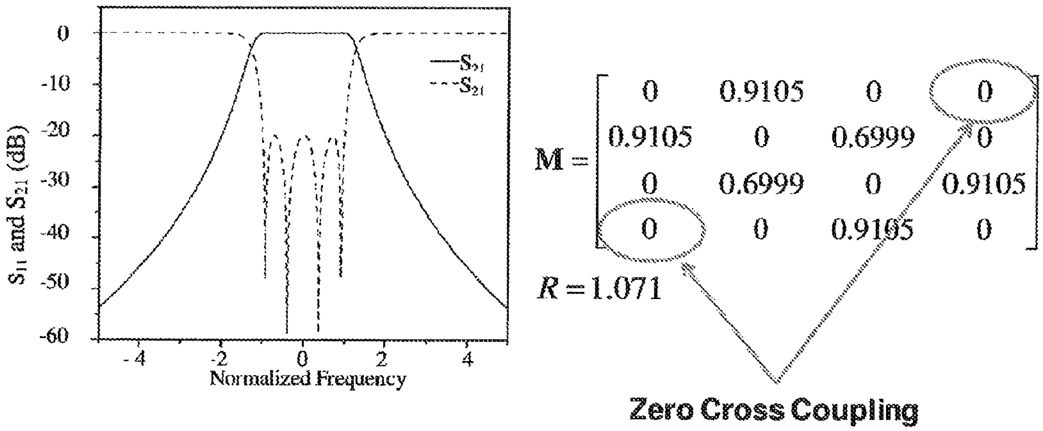
FIG. 12B illustrates an ideal 4 pole filter where there is no “undesired” cross coupling.
Figure 13A:
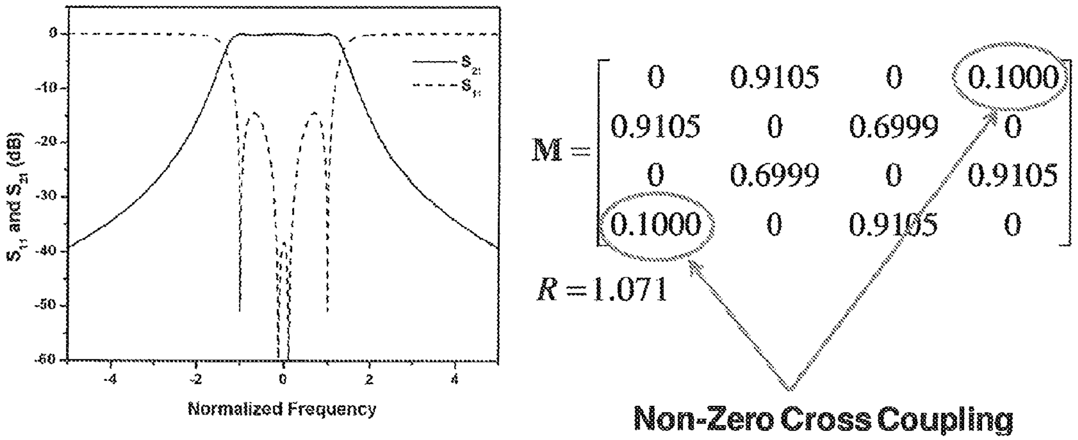
FIG. 13A illustrates a 4 pole filter with “undesired” cross coupling between resonator 1 and 4.

The ability to reconfigure the coupling between adjacent resonators in the array configuration can provide for diverse operation. The 2 to 4 pole filter can require direct coupling from resonator 1 to 2 when operating as a 2-pole filter, but that coupling needs to be eliminated when operating as a 4-pole filter. FIG. 12A shows a top view of the proposed 2- to 4-pole filter along with the coupling coefficient matrix. Each coupling coefficient is represented by an arrow. For the 4-pole case $k_{14}$ and $k_{41}$ should be zero. The ideal 4-pole filter performance is shown in FIG. 12B. However, if there is non-zero coupling between the first and forth resonator the frequency response will be affected by a ripple in the pass band and the return loss ripple will become uneven. This slightly corrupted performance is shown in FIG. 13A where a small coupling between resonators 1 and 4 is simulated by making $k_{14}$ and $k_{41}$ non-zero.

Figure 13B:
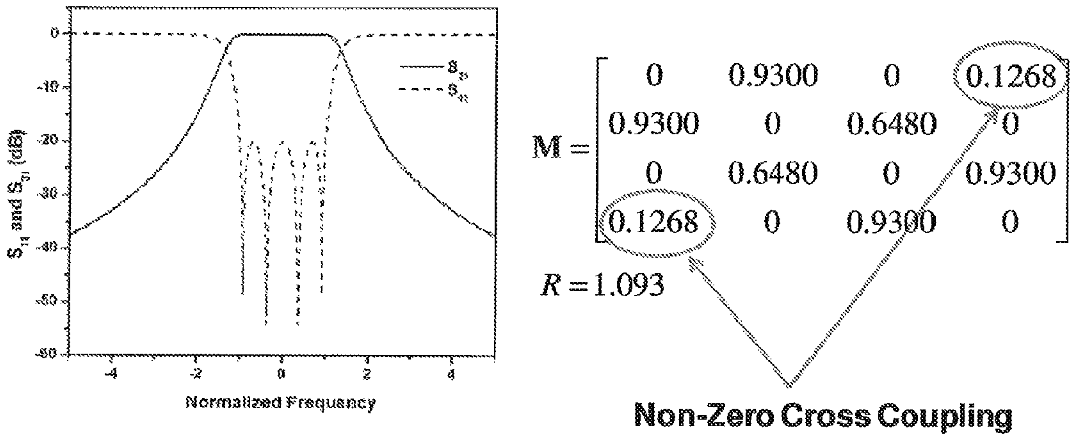
FIG. 13B illustrates a reconfigured 4 pole filter response that accounts for the non-zero cross coupling between resonator 1 and 4.

Using the reconfigurability of the filter couplings, the other couplings can be adjusted to compensate for the non-zero cross coupling and form a self-equalized filter response [9] as shown in FIG. 13B. This ideal filter response is created by adjusting the coupling of the other terms, in this case $k_{12}$, $k_{23}$, and $k_{34}$ which returns the filter to the ideal state even without ideal coupling levels from $k_{14}$. This demonstrates the adaptability of the reconfigurable filter array, even if $k_{14}$ exists.

Advanced Array Demonstration: Exotically Reconfigurable Resonator Network

Another example is the use of multiple resonators that are not defined explicitly but share reconfigurable boundaries. This relies on the use of a "sea of capacitive" posts, which can be tuned in order to act as resonator boundaries and/or resonator capacitances. Each post should be individually tunable and the size of the resonator, the shape of the resonator, and the coupling to other resonances in the network are each dynamically addressable through the capacitances of each section.

Figure 14:
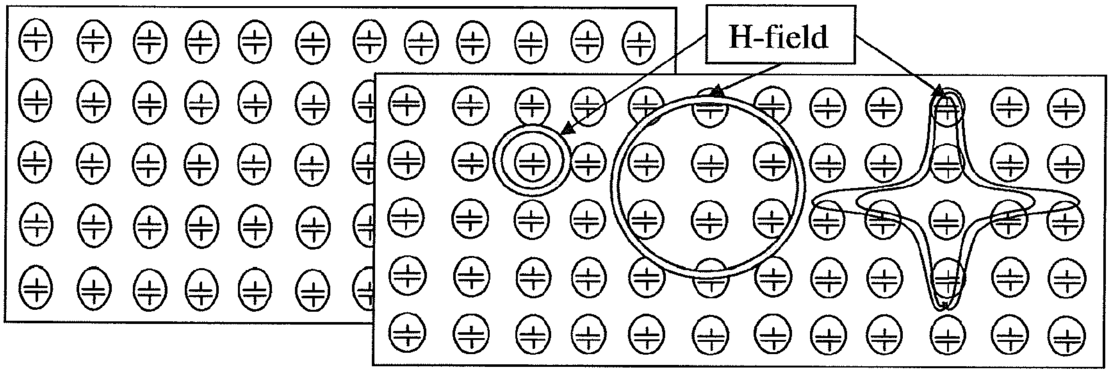
FIG. 14 illustrates an exotically reconfigurable resonator array with examples of several different unit cells.

Using capacitances instead of solid posts can create impedance barriers to define the cavity as opposed to a defined wall of vias approximating a Perfect Electrically Conducting (PEC) wall. This impedance barrier can give the ability to dynamically redefine the shape of the resonator. In turn, this can allow for the control of the coupling between resonators. All of the barriers between resonators can be dynamic, allowing for full reconfiguration of both bandwidth and frequency. For example, using four capacitors together as the central post can give a much greater capacitance and would be useful for the low frequency range. If a single capacitor were to be used, the capacitance would be applicable for the high frequency range. This implementation can result in tradeoffs between tunability and Q. This variable distance wall can give a change in inductance of a resonator as the location of return path for the resonator is dynamically changed. The walls can define the closest array of capacitive posts from the central post creating a small resonator or the walls can open to create unique H-field distributions as shown in FIG. 14. A cavity resonator with variable walls can result. In FIG. 14 the smallest cell size in an evanescent-mode configuration is illustrated on the left side. In the middle there is a larger evanescent-mode cavity. To the far right there is an unorthodox shaped filter, showing that arbitrary shapes are possible. The contours represent the magnetic field distribution.

Further details regarding embodiments described above may be found in the following papers which are incorporated herein by reference in their entireties:

Sigmarsson, H. H. et al., "Reconfigurable-Order Bandpass Filter for Frequency Agile Systems," 2010 *IEEE MiT-S International Microwave Symposium Digest* (*MTT*), May 23-28, 2010, Anaheim, Calif., pp. 1756-1759; and Naglich, E. et al., "Tunable, Substrate Integrated, High Q Filter Cascade for High Isolation," 2010 *IEEE MTT-S International Microwave Symposium Digest* (*MTT*), May 23-28, 2010, Anaheim, Calif., pp. 1468-1471.

Additional information concerning components useful in certain embodiments of the present invention is available in PCT Patent Application No. PCT/US2009/059466, filed Oct. 3, 2009, published under International Publication Number WO 2010/040119 on Apr. 8, 2010. This published application is incorporated herein by reference in its entirety.

While the invention has been illustrated and described in detail in the drawings and foregoing description, the same is to be considered as illustrative and not restrictive in character, it being understood that only preferred embodiments have been shown and described and that all changes and modifications that come within the spirit of the invention are desired to be protected.

REFERENCES

Incorporated Herein by Reference in their Entireties

[1] X. Liu, L. P. B. Katehi, W. J. Chappell, and D. Peroulis, "A 3.4-6.2 GHz Continuously tunable electrostatic MEMS resonator with quality factor of 460-530," *IEEE MTT-S International Microwave Symposium Digest,* 7-12 Jun. 2009, pp. 1149-1152.

[2] H. Joshi, H. H. Sigmarsson, D. Peroulis, and W. J. Chappell, "Highly Loaded Evanescent Cavities for Widely Tunable High-Q Filters" *IEEE MTT-S International Microwave Symposium Digest*, June 2007, pp. 2133-2136.

[3] H. Joshi, H. H. Sigmarsson, S. Moon, D. Peroulis, and W. J. Chappell, "High Q Narrowband Tunable Filters With Controllable Bandwidth," *IEEE MTT-S International Microwave Symposium Digest*, June 2009, pp. 629-632.

[4] H. H. Sigmarsson, A. Christianson, H. Joshi, S. Moon, D. Peroulis, and W. J. Chappell, "In-Situ Control of Tunable Evanescent-Mode Cavity Filters Using Differential Mode Monitoring," *IEEE MTT-S International Microwave Symposium Digest*, June 2009, pp. 633-636.

[5] H. Joshi, H. H. Sigmarsson, S. Moon, D. Peroulis, and W. J. Chappell, "Tunable High Q Narrow-Band Triplexer," *IEEE MTT-S International Microwave Symposium Digest*, June 2009, pp. 1477-1480.

[6] H. Joshi, H. H. Sigmarsson, S. Moon, D. Peroulis, and W. J. Chappell, "High Q Fully Reconfigurable Tunable Band Pass Filters," accepted for publication in *IEEE Transactions on Microwave Theory and Techniques.*

[7] A. E. Atia and A. E. Williams, "Narrow-Bandpass Waveguide Filters," *IEEE Transactions on Microwave Theory and Techniques*, vol. 20, no. 4, pp. 258-265, April 1972.

[8] J. Lee and K. Sarabandi, "A Miniaturized Conductor-Backed Slot-Line Resonator Filter With Two Transmission Zeros," *IEEE Microwave and Wireless Components Letters*, vol. 16, no. 12, pp. 660-662, December 2006.

[9] J. D. Rhodes, "A Low-Pass Prototype Network for Microwave Linear Phase Filters," *IEEE Transactions on Microwave Theory and Techniques*, vol. 18, no. 6, pp. 290-301, June 1970.

[10] G. L. Matthaei and E. M. T. Jones, "Microwave Filters, Impedance Matching Networks and Coupling Structures," New York, McGraw-Hill, 1980.

We claim:

1. A field programmable filter array, comprising:

an array of resonators;

a variable coupling mechanism for coupling a first of said array of resonators to a selected second of said array of resonators, said coupling mechanism capable of altering filter bandwidth and selectively redirecting energy between said array of resonators; each resonator comprising:

a first resonator cavity;

a second resonator cavity; and a feed layer positioned over said first resonator cavity and said second resonator cavity, said feed layer including a first slot aperture for magnetic coupling to said first resonator cavity and a second slot aperture for magnetic coupling to said second resonator cavity.

2. The field programmable filter array of claim 1, wherein said variable coupling mechanism includes a plurality of varactors.

3. The field programmable filter array of claim 2, wherein said variable coupling mechanism includes a plurality of switches.

4. A reconfigurable filter capable of selectively operating in a bandpass mode or a bandstop mode, comprising:

first and second adjacent high-Q resonators; and a feed layer over said first and second resonators, said feed layer having first and second slot apertures therethrough for magnetic field coupling to said first and second resonators, respectively;

wherein said filter is selectively configurable to said bandpass mode or to said bandstop mode by electronically altering said feed layer either to create an effective short circuit therein or to create a through line, respectively.

5. The reconfigurable filter of claim 4, wherein said first and second resonators are electronically reconfigurable so as to operate as either the bandpass filter or the bandstop filter with high-speed tuning over approximately an octave in frequency.

6. A field programmable filter array comprising a plurality of filter unit cells each having a plurality of degrees of reconfigurability including electronically reconfigurable filter type, order and bandwidth, each filter unit cell comprising:

a first resonator cavity;

a second resonator cavity; and a feed layer positioned over said first cavity and said second resonator cavity, said feed layer including a first slot aperture for magnetic coupling to said first resonator cavity and a second slot aperture for magnetic coupling to said second resonator cavity.

7. The field programmable filter array of claim 6, wherein said plurality of filter unit cells have electronically reconfigurable filter frequency and shape.

8. The field programmable filter array of claim 6, wherein said plurality of filter unit cells are electronically reconfigurable so as to operate as either a bandpass filter or a bandstop filter with high-speed tuning over approximately an octave in frequency.

9. The field programmable filter array of claim 1, wherein each of said array of resonators is selectively configurable to operate in a bandpass mode or to operate in a bandstop mode by electronically altering said feed layer in each resonator to form an effective short circuit therein or to form a through line therein, respectively.

10. The field programmable filter array of claim 1, wherein said first array of resonator cavity and said second resonator cavity in each of said resonators are electronically reconfigurable so as to operate as either a bandpass filter or a bandstop filter with high-speed tuning over approximately an octave in frequency.

11. The field programmable filter array of claim 6, wherein each unit cell is selectively configurable to operate in a bandpass mode or to operate in a bandstop mode by electronically altering said feed layer in each unit cell to form an effective short circuit therein or to form a through line therein, respectively.

12. The field programmable filter array of claim 6, wherein said first resonator cavity and said second resonator cavity in each of said plurality of filter unit cells are electronically reconfigurable so as to operate as bandpass or bandstop filters with high-speed tuning over approximately an octave in frequency.

* * * * *